United States Patent
Li et al.

(10) Patent No.: US 10,958,383 B2
(45) Date of Patent: Mar. 23, 2021

(54) TIME BASED REDUNDANCY VERSION DETERMINATION FOR GRANT-FREE SIGNALING

(71) Applicant: QUALCOMM Incorporated, San Diego, CA (US)

(72) Inventors: Chong Li, Weehawken, NJ (US); Chih-Ping Li, San Diego, CA (US); Jing Jiang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/208,162

(22) Filed: Dec. 3, 2018

(65) Prior Publication Data

US 2019/0173619 A1    Jun. 6, 2019

Related U.S. Application Data

(60) Provisional application No. 62/595,141, filed on Dec. 6, 2017.

(51) Int. Cl.
*H04L 1/18* (2006.01)
*H04W 76/27* (2018.01)
(Continued)

(52) U.S. Cl.
CPC .......... *H04L 1/1819* (2013.01); *H03M 13/13* (2013.01); *H04L 1/189* (2013.01); *H04L 1/1887* (2013.01);
(Continued)

(58) Field of Classification Search
CPC . H04L 1/08; H04L 1/18; H04L 1/1819; H04L 69/40; H04L 76/27; H04L 27/2605;
(Continued)

(56) References Cited

U.S. PATENT DOCUMENTS 7,830,972 B2 * 11/2010 Kwon ................... H04L 5/0007
375/260
9,021,341 B1 * 4/2015 Srinivasa .............. H04L 1/0033
714/776
(Continued)

OTHER PUBLICATIONS

Huawei et al., "Grant-free Resource Configuration", 3GPP DRAFT; R2-1705118 Grant-free Resource Configuration, 3rd Generation Partnership Project (3GPP), Mobile Competence Centre, 650, Route Des Lucioles, F-06921 Sophia-Antipolis Cedex, France, vol. RAN WG2, No. Hangzhou, China; May 15, 2017-May 19, 2017 May 14, 2017 (May 14, 2017), XP051275594, Retrieved from the Internet: URL:http://www.3gpp.org/ftp/Meetings_3GPP_SYNC/RAN2/Docs/ [retrieved on May 14, 2017], 4 pages.
(Continued)

*Primary Examiner* — Warner Wong
(74) *Attorney, Agent, or Firm* — Patterson & Sheridan, LLP

(57) ABSTRACT

Certain aspects of the present disclosure generally relate to wireless communications and, more particularly, to methods and apparatus for rate-matching a stream of bits encoded using polar codes. An exemplary method generally includes determining, based on a time of a transmission, a redundancy version (RV) of data to be transmitted in the transmission and transmitting the determined RV of the data via a wireless medium at the time.

30 Claims, 12 Drawing Sheets

(51) Int. Cl.
*H04W 72/12* (2009.01)
*H03M 13/13* (2006.01)
*H04L 27/26* (2006.01)
*H04L 5/00* (2006.01)
*H04W 80/02* (2009.01)

(52) U.S. Cl.
CPC ..... H04L 27/2605 (2013.01); H04W 72/1268 (2013.01); H04W 76/27 (2018.02); *H04L 5/0007* (2013.01); *H04W 80/02* (2013.01)

(58) Field of Classification Search
CPC .. H04W 80/02; H04W 72/1268; H03M 13/13
See application file for complete search history.

(56) References Cited

U.S. PATENT DOCUMENTS

| | | | |
|---|---|---|---|
| 2003/0142630 A1* | 7/2003 | Budde | H04L 12/43 370/251 |
| 2005/0202824 A1* | 9/2005 | Goldhammer | H04W 72/082 455/447 |
| 2007/0218915 A1* | 9/2007 | Yang | H04L 5/023 455/450 |
| 2009/0092174 A1* | 4/2009 | Wang | H04L 27/2613 375/132 |
| 2009/0274037 A1* | 11/2009 | Lee | H04L 1/1812 370/208 |
| 2011/0200004 A1* | 8/2011 | Nakashima | H04L 5/0053 370/330 |
| 2012/0120865 A1* | 5/2012 | Liang | H04L 5/0053 370/315 |
| 2014/0036865 A1* | 2/2014 | Camarda | H04L 5/0007 370/330 |
| 2016/0029352 A1* | 1/2016 | Wong | H04L 1/001 370/315 |
| 2016/0043830 A1* | 2/2016 | Simon | H04L 27/2607 375/295 |
| 2016/0249364 A1* | 8/2016 | Siomina | H04W 72/082 |
| 2017/0086081 A1* | 3/2017 | Kim | H04W 4/027 |
| 2017/0093899 A1* | 3/2017 | Horesh | G06N 5/04 |
| 2017/0135029 A1* | 5/2017 | Chendamarai Kannan | H04W 72/04 |
| 2017/0223650 A1* | 8/2017 | Ko | H04J 13/0062 |
| 2017/0288817 A1 | 10/2017 | Cao et al. | |
| 2018/0109358 A1* | 4/2018 | Xing | H04L 1/1816 |
| 2018/0287731 A1* | 10/2018 | Wang | H04L 1/007 |
| 2018/0319752 A1* | 11/2018 | Sakuma | C07D 401/12 |
| 2019/0081745 A1* | 3/2019 | Qin | H04L 1/1812 |
| 2019/0081763 A1* | 3/2019 | Akkarakaran | H04L 1/1607 |
| 2019/0132082 A1* | 5/2019 | Ma | H04L 1/0067 |
| 2019/0150164 A1* | 5/2019 | Nam | H04L 1/1819 370/329 |
| 2019/0223165 A1* | 7/2019 | Lyu | H04W 72/042 |
| 2019/0297635 A1* | 9/2019 | Wu | H04L 1/1893 |
| 2019/0349135 A1* | 11/2019 | Xu | H04L 1/1812 |
| 2020/0228254 A1* | 7/2020 | Ma | H04L 1/1825 |

OTHER PUBLICATIONS

Huawei et al., "Grant-free Transmission for UL URLLC", 3GPP DRAFT; R1-1704222, 3rd Generation Partnership Project (3GPP), Mobile Competence Centre, 650, Route Des Lucioles, F-06921 Sophia-Antipolis Cedex, France, vol. RAN WG1, No. Spokane, USA; Apr. 3, 2017-Apr. 7, 2017 Apr. 2, 2017 (Apr. 2, 2017), XP051242374, Retrieved from the Internet: URL:http://www.3gpp.org/ftp/Meetings_3GPP_SYNC/RAN1/Docs/ [retrieved on Apr. 2, 2017], 7 pages.

Huawei et al., "On Sub-RB Resource Allocation for MTC PUSCH", 3GPP DRAFT; R1-1719465, 3rd Generation Partnership Project (3GPP), Mobile Competence Centre, 650, Route Des Lucioles, F-06921 Sophia-Antipolis Cedex, France, vol. RAN WG1, No. Reno, USA; Nov. 27, 2017-Dec. 1, 2017 Nov. 17, 2017 (Nov. 17, 2017), XP051369163, Retrieved from the Internet: URL:http://www.3gpp.org/ftp/tsg%5Fran/WG1%5FRL1/TSGR1%5F91/Docs/ [retrieved on Nov. 17, 2017], 6 pages.

International Search Report and Written Opinion—PCT/US2018/063854—ISA/EPO—dated Feb. 25, 2019.

NTT Docomo et al., "Email discussions on UL Transmission Procedures", 3GPP Draft; R1-1718814, 3rd Generation Partnership Project (3GPP), Mobile Competence Centre, 650, Route Des Lucioles, F-06921 Sophia-Antipolis Cedex, France, vol. RAN WG1, No. Prague, CZ; Oct. 9, 2017-Oct. 13, 2017 Oct. 9, 2017, XP051353300, Retrieved from the Internet: URL:http://www.3gpp.org/ftp/tsg_ran/WG1_RL1/TSGR1_90b/Docs/ [retrieved on Oct. 9, 2017], 34 pages.

Qualcomm Incorporated: "Summary DL/UL Scheduling and HARQ Management", 3GPP Draft; R1-1716865_SUMMARY_6.3.3.2_SCHEDULING_HARQ_MGMT_V5, 3rd Generation Partnership Project (3GPP), Mobile Competence Centre, 650, Route Des Lucioles, F-06921 Sophia-Antipolis Cedex, France, vol. RAN WG1, No. Nagoya, Japan; Sep. 18, 2017-Sep. 21, 2017, Sep. 25, 2017, XP051353942, Retrieved from the Internet: URL:http://www.3gpp.org/ftp/tsg_ran/WG1_RL1/TSGR1_AH/NR_AH_1709/Docs/ [retrieved on—Sep. 25, 2017], 10 pages.

Zte et al., "Further Discussion on UL Transmission without Grant", 3GPP DRAFT; R1-1715562 Further Discussion on UL Transmission without Grant, 3rd Generation Partnership Project (3GPP), Mobile Competence Centre, 650, Route Des Lucioles, F-06921 Sophia-Antipolis Cedex, France, vol. RAN WG1, No. Nagoya, Japan; Sep. 18, 2017-Sep. 21, 2017 Sep. 17, 2017 (Sep. 17, 2017), XP051339029, Retrieved from the Internet: URL:http://www.3gpp.org/ftp/Meetings_3GPP_SYNC/RAN1/Docs/ [retrieved on Sep. 17, 2017], 7 pages.

Zte et al., "Remaining Details of UL Transmission without Grant", 3GPP Draft; R1-1717442 Remaining Details of UL Transmission without Grant, 3rd Generation Partnership Project (3GPP), Mobile Competence Centre, 650, Route Des Lucioles, F-06921 Sophia-Antipolis Cedex, France, vol. RAN WG1, No. Prague, CZ; Oct. 9, 2017-Oct. 13, 2017 Oct. 8, 2017, XP051340631, Retrieved from the Internet: URL:http://www.3gpp.org/ftp/Meetings_3GPP_SYNC/RAN1/Docs/ [retrieved on Oct. 8, 2017], 8 pages.

* cited by examiner

TIME BASED REDUNDANCY VERSION DETERMINATION FOR GRANT-FREE SIGNALING

CROSS-REFERENCE TO RELATED APPLICATIONS

The present Application for patent claims benefit of and priority to U.S. Provisional Patent Application No. 62/595,141, filed Dec. 6, 2017, which is assigned to the assignee hereof and hereby expressly incorporated by reference herein in its entirety as if fully set forth below and for all applicable purposes.

BACKGROUND

Field of the Disclosure

Certain aspects of the present disclosure generally relate to wireless communications and, more particularly, to methods and apparatus for determining a hybrid automatic retransmission request (HARQ) redundancy version (RV) of a grant-free transmission for use with ultra-reliable low latency communications (URLLC).

Description of Related Art

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include Long Term Evolution (LTE) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

In some examples, a wireless multiple-access communication system may include a number of base stations, each simultaneously supporting communication for multiple communication devices, otherwise known as user equipment (UEs). In LTE or LTE-A network, a set of one or more base stations may define an e NodeB (eNB). In other examples (e.g., in a next generation or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more distributed units, in communication with a central unit, may define an access node (e.g., a new radio base station (NR BS), a new radio node-B (NR NB), a network node, 5G NB, gNB, etc.). A base station or DU may communicate with a set of UEs on downlink channels (e.g., for transmissions from a base station or to a UE) and uplink channels (e.g., for transmissions from a UE to a base station or distributed unit).

These multiple access technologies have been adopted in various telecommunication standards to provide a common protocol that enables different wireless devices to communicate on a municipal, national, regional, and even global level. An example of an emerging telecommunication standard is new radio (NR), for example, 5G radio access. NR is a set of enhancements to the LTE mobile standard promulgated by Third Generation Partnership Project (3GPP). It is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL) as well as support beamforming, multiple-input multiple-output (MIMO) antenna technology, and carrier aggregation.

However, as the demand for mobile broadband access continues to increase, there exists a need for further improvements in NR technology. Preferably, these improvements should be applicable to other multi-access technologies and the telecommunication standards that employ these technologies.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications in a wireless network.

Certain aspects of the present disclosure provide a method for wireless communications in a network. The method generally includes determining, based on a time of a transmission, a redundancy version (RV) of data to be transmitted in the transmission and transmitting the determined RV of the data via a wireless medium at the time.

Certain aspects of the present disclosure provide a method for wireless communications in a network. The method generally includes receiving a transmission via a wireless medium; determining, based on a time of a transmission, a redundancy version (RV) of data in the transmission; and decoding the data in the transmission based on the determined RV.

Certain aspects of the present disclosure provide a method for wireless communications in a network. The method generally includes determining, based on a redundancy version (RV) of data to be transmitted in a group of K repeated uplink (UL) transmissions, a time to transmit the K repeated UL transmissions and transmitting the K repeated UL transmissions based on a redundancy version pattern via a wireless medium at the determined time.

Certain aspects of the present disclosure provide an apparatus for wireless communications in a network. The apparatus generally includes a processor configured to determine, based on a time of a transmission, a redundancy version (RV) of data to be transmitted in the transmission and to cause the apparatus to transmit the determined RV of the data via a wireless medium at the time and a memory coupled with the processor.

Certain aspects of the present disclosure provide an apparatus for wireless communications in a network. The apparatus generally includes a processor configured to cause the apparatus to receive a transmission via a wireless medium, to determine, based on a time of a transmission, a redundancy version (RV) of data in the transmission, and to decode the data in the transmission based on the determined RV and a memory coupled with the processor.

Certain aspects of the present disclosure provide an apparatus for wireless communications in a network. The apparatus generally includes a processor configured to determine, based on a redundancy version (RV) of data to be transmitted in a group of K repeated uplink (UL) transmissions, a time to transmit the K repeated uplink (UL) transmissions and to cause the apparatus to transmit the K repeated UL transmissions based on a redundancy version pattern via a wireless medium at the determined time and a memory coupled with the processor.

Certain aspects of the present disclosure provide an apparatus for wireless communications in a network. The apparatus generally includes means for determining, based on a time of a transmission, a redundancy version (RV) of data to be transmitted in the transmission and means for transmitting the determined RV of the data via a wireless medium at the time.

Certain aspects of the present disclosure provide an apparatus for wireless communications in a network. The apparatus generally includes means for receiving a transmission via a wireless medium, means for determining, based on a time of a transmission, a redundancy version (RV) of data in the transmission, and means for decoding the data in the transmission based on the determined RV.

Certain aspects of the present disclosure provide an apparatus for wireless communications in a network. The apparatus generally includes means for determining, based on a redundancy version (RV) of data to be transmitted in a group of K repeated uplink (UL) transmissions, a time to transmit the K repeated UL transmissions and means for transmitting the group of K repeated UL transmissions based on a redundancy version pattern via a wireless medium at the determined time.

Certain aspects of the present disclosure provide a non-transitory computer-readable medium for wireless communications in a network. The non-transitory computer-readable medium generally includes instructions that, when executed by at least one processor, cause the at least one processor to determine, based on a time of a transmission, a redundancy version (RV) of data to be transmitted in the transmission and to transmit the determined RV of the data via a wireless medium at the time.

Certain aspects of the present disclosure provide a non-transitory computer-readable medium for wireless communications in a network. The non-transitory computer-readable medium generally includes instructions that, when executed by at least one processor, cause the at least one processor to receive a transmission via a wireless medium, to determine, based on a time of a transmission, a redundancy version (RV) of data in the transmission, and to decode the data in the transmission based on the determined RV.

Certain aspects of the present disclosure provide a non-transitory computer-readable medium for wireless communications in a network. The non-transitory computer-readable medium generally includes instructions that, when executed by at least one processor, cause the at least one processor to determine, based on a redundancy version (RV) of data to be transmitted in a group of K repeated uplink (UL) transmissions, a time to transmit the K repeated UL transmissions and to transmit the K repeated UL transmissions based on a redundancy version pattern via a wireless medium at the determined time.

Numerous other aspects are provided including methods, apparatus, systems, computer program products, and processing systems.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
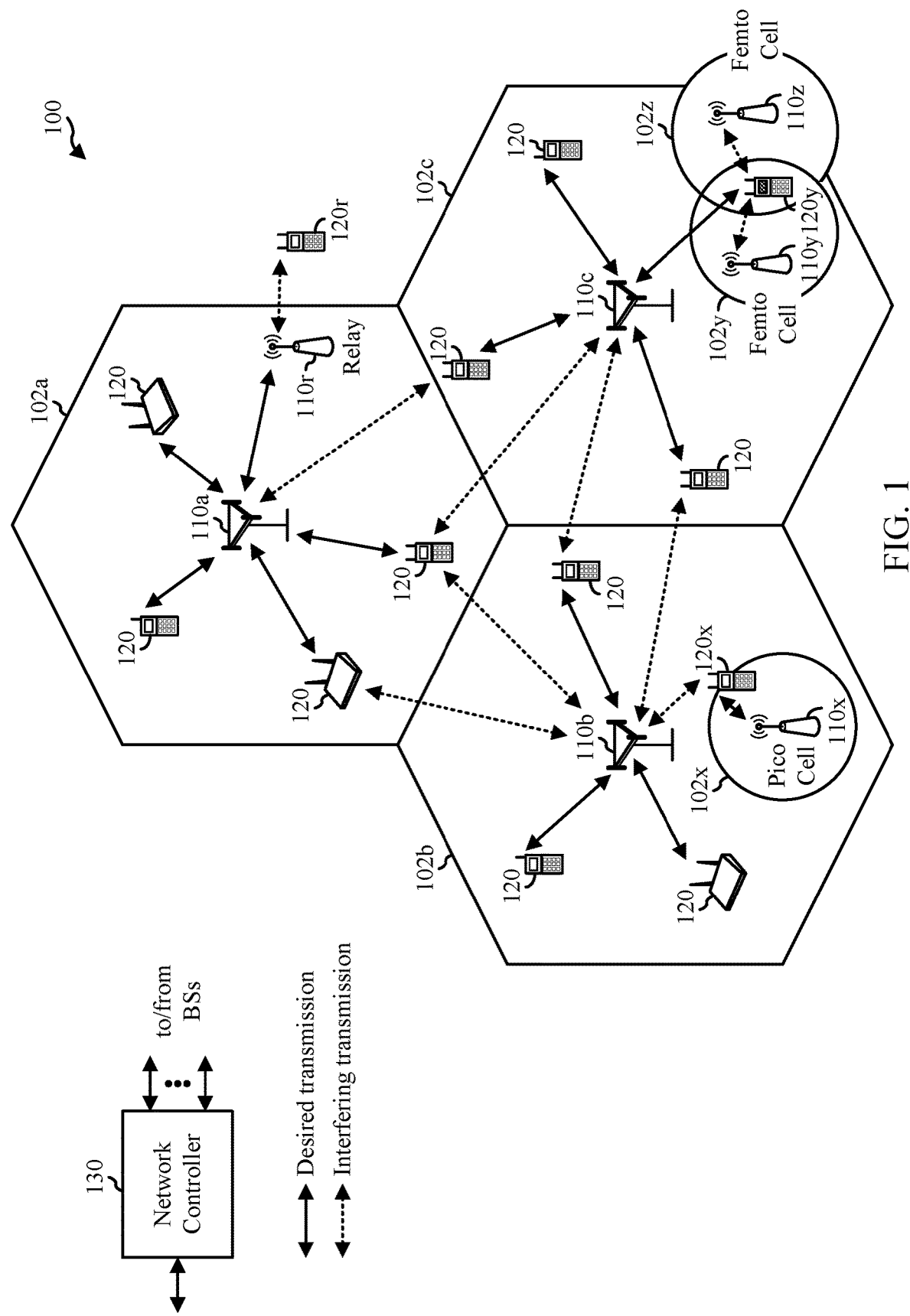
FIG. 1 is a block diagram conceptually illustrating an example telecommunications system, in accordance with certain aspects of the present disclosure.

Aspects of the present disclosure provide apparatus, methods, processing systems, and computer readable mediums for multi-slice networks, such as new radio (NR) (new radio access technology or 5G technology).

New radio (NR) may refer to radios configured to operate according to a new air interface (e.g., other than Orthogonal Frequency Divisional Multiple Access (OFDMA)-based air interfaces) or fixed transport layer (e.g., other than Internet Protocol (IP)). NR may include Enhanced mobile broadband (eMBB) techniques targeting wide bandwidth (e.g. 80 MHz and wider) communications, millimeter wave (mmW) techniques targeting high carrier frequency (e.g. 27 GHz and higher) communications, massive machine-type communications (mMTC) techniques targeting non-backward compatible machine-type communications (MTC), and mission critical targeting ultra reliable low latency communications (URLLC). These services may include latency and reliability requirements. These services may also have different transmission time intervals (TTI) to meet respective quality of service (QoS) requirements. In addition, these services may co-exist in the same subframe.

Aspects of the present disclosure relate to grant-free (GF) uplink (UL) transmissions in ultra-reliable low latency communications (URLLC). According to previously known techniques, there are at least two types of grant-free uplink communications. In a first type of GF UL communications, a UE performs a first transmission in a grant-free manner by randomly selecting certain resources (e.g., time and frequency resources) or using semi-statistically configured resources and transmitting on the selected resources, a behavior that may conflict with scheduled on-going eMBB traffic. If the first transmission fails in decoding, but is successfully detected by a serving cell, then the cell may transmit a downlink (DL) physical downlink control channel (PDCCH) in a next mini-slot that schedules a resource for the UE to use in transmitting second transmission. In the meanwhile, on-going eMBB traffic on the scheduled resource will be suspended (e.g., the cell does not schedule any DL or UL transmissions on the resource). In a second type of GF UL communications, second and later UL transmissions by a UE are also GF. That is, a UE transmits GF UL transmissions repeatedly until the UE receives an acknowledgment (ACK) for one of the transmissions of the UE transmits a maximum number, K, of repeated GF UL transmissions.

According to aspects of the present disclosure, a UE may use incremental redundancy (IR) while transmitting a GF UL transmission. A UE using IR generates several redundancy versions (RVs) of the data to be transmitted, and the UE selects one of the RVs for transmission in a first GF UL transmission. If the UE transmits a second GF UL transmission of the same data (e.g., the UE did not receive an ACK of the first transmission), the UE selects a different RV of the data for the second transmission. Each time the UE transmits the data, the UE may select a different RV of the data. The UE may continue to retransmit the data until the data is acknowledged (e.g., the UE receives an ACK for the data) or the number of retransmissions is equal to a maximum number of HARQ retransmissions parameter, which may be set by higher layers, for example. If the maximum number of HARQ retransmissions parameter is larger than the number of RVs, then the UE may repeat earlier-sent RVs in later retransmissions. A base station receiving the different RVs of the data may decode any one of the RVs and may, if the base station cannot decode any single RV, decode the data based on a combination of the different RVs. A redundancy version (RV) pattern, e.g., {0,2,3,1}, needs to be known to a receiving device for the receiving device to use IR combining. This RV pattern is may be carried in uplink control information (UCI) via UL control channel or may be configured via Radio Resource Configuration (RRC) signaling.

In aspects of the present disclosure, a UE using IR for GF UL transmissions may determine an RV for transmission based on a time of the transmission.

According to aspects of the present disclosure, a BS receiving a GF UL transmission from a UE may determine an RV of the transmission based on a time that the BS receives the transmission.

In NR, polar codes may be used to encode a stream of bits for transmission. However, in some cases, using a traditional rate matching scheme (e.g., for TBCC codes) may lead to performance loss when used with polar codes. Thus, aspects of the present disclosure propose an efficient rate-matching scheme to be used to rate-match a stream of bits encoded using a polar code.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

The techniques described herein may be used for various wireless communication networks such as CDMA, TDMA, FDMA, OFDMA, SC-FDMA and other networks. The terms "network" and "system" are often used interchangeably. A CDMA network may implement a radio technology such as universal terrestrial radio access (UTRA), cdma2000, etc. UTRA includes wideband CDMA (WCDMA), time division synchronous CDMA (TD-SCDMA), and other variants of CDMA. cdma2000 covers IS-2000, IS-95 and IS-856 standards. A TDMA network may implement a radio technology such as global system for mobile communications (GSM). An OFDMA network may implement a radio technology such as evolved UTRA (E-UTRA), ultra mobile broadband (UMB), IEEE 802.11 (Wi-Fi), IEEE 802.16 (WiMAX), IEEE 802.20, Flash-OFDM®, etc. UTRA and E-UTRA are part of universal mobile telecommunication system (UMTS). 3GPP Long Term Evolution (LTE) and LTE-Advanced (LTE-A), in both frequency division duplex (FDD) and time division duplex (TDD), are new releases of UMTS that use E-UTRA, which employs OFDMA on the downlink and SC-FDMA on the uplink. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies, such as a 5G nextgen/NR network.

Example Wireless Communications System

FIG. 1 illustrates an example wireless network 100, such as a new radio (NR) or 5G network, in which aspects of the present disclosure may be practiced. In some cases, the network 100 may be a multi-slice network, each slice defines as a composition of adequately configured network functions, network applications, and underlying cloud infrastructures that are bundled together to meet the requirement of a specific use case or business model.

As illustrated in FIG. 1, the wireless network 100 may include a number of BSs 110 and other network entities. A BS may be a station that communicates with UEs. Each BS 110 may provide communication coverage for a particular geographic area. In 3GPP, the term "cell" can refer to a coverage area of a Node B and/or a Node B subsystem serving this coverage area, depending on the context in which the term is used. In NR systems, the term "cell" and eNB, Node B, 5G NB, AP, NR BS, NR BS, BS, or TRP may be interchangeable. In some examples, a cell may not necessarily be stationary, and the geographic area of the cell may move according to the location of a mobile base station. In some examples, the base stations may be interconnected to one another and/or to one or more other base stations or network nodes (not shown) in the wireless network 100 through various types of backhaul interfaces such as a direct physical connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs. In some cases, NR or 5G RAT networks may be deployed, employing a multi-slice network architecture.

A BS may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BS for the femto cells 102y and 102z, respectively. A BS may support one or multiple (e.g., three) cells.

The wireless network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

The wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, macro BS may have a high transmit power level (e.g., 20 Watts) whereas pico BS, femto BS, and relays may have a lower transmit power level (e.g., 1 Watt).

The wireless network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another, e.g., directly or indirectly via wireless or wireline backhaul.

The UEs 120 (e.g., 120x, 120y, etc.) may be dispersed throughout the wireless network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered evolved or machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices.

In FIG. 1, a solid line with double arrows indicates desired transmissions between a UE and a serving BS, which is a BS designated to serve the UE on the downlink and/or uplink. A dashed line with double arrows indicates interfering transmissions between a UE and a BS.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a 'resource block') may be 12 subcarriers (or 180 kHz). Consequently, the nominal FFT size may be equal to 128, 256, 512, 1024 or 2048 for system bandwidth of 1.25, 2.5, 5, 10 or 20 megahertz (MHz), respectively. The system bandwidth may also be partitioned into subbands. For example, a subband may cover 1.08 MHz (i.e., 6 resource blocks), and there may be 1, 2, 4, 8 or 16 subbands for system bandwidth of 1.25, 2.5, 5, 10 or 20 MHz, respectively.

While aspects of the examples described herein may be associated with LTE technologies, aspects of the present disclosure may be applicable with other wireless communications systems, such as NR/5G.

NR may utilize OFDM with a CP on the uplink and downlink and include support for half-duplex operation using TDD. A single component carrier bandwidth of 100 MHz may be supported. NR resource blocks may span 12 sub-carriers with a subcarrier bandwidth of 75 kHz over a 0.1 ms duration. Each radio frame may consist of 2 half frames, each half frame consisting of 5 subframes, with a length of 10 ms. Consequently, each subframe may have a length of 1 ms. Each subframe may indicate a link direction (i.e., DL or UL) for data transmission and the link direction for each subframe may be dynamically switched. Each subframe may include DL/UL data as well as DL/UL control data. UL and DL subframes for NR may be as described in more detail below with reference to FIGS. 9 and 10. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based. NR networks may include entities such CUs and/or DUs.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. That is, in some examples, a UE may function as a scheduling entity, scheduling resources for one or more subordinate entities (e.g., one or more other UEs). In this example, the UE is functioning as a scheduling entity, and other UEs utilize resources scheduled by the UE for wireless communication. A UE may function as a scheduling entity in a peer-to-peer (P2P) network, and/or in a mesh network. In a mesh network example, UEs may optionally communicate directly with one another in addition to communicating with the scheduling entity.

Thus, in a wireless communication network with a scheduled access to time-frequency resources and having a cellular configuration, a P2P configuration, and a mesh configuration, a scheduling entity and one or more subordinate entities may communicate utilizing the scheduled resources.

As noted above, a RAN may include a CU and DUs. A NR BS (e.g., gNB, 5G Node B, Node B, transmission reception point (TRP), access point (AP)) may correspond to one or multiple BSs. NR cells can be configured as access cell (ACells) or data only cells (DCells). For example, the RAN (e.g., a central unit or distributed unit) can configure the cells. DCells may be cells used for carrier aggregation or dual connectivity, but not used for initial access, cell selection/reselection, or handover. In some cases DCells may not transmit synchronization signals—in some case cases DCells may transmit SS. NR BSs may transmit downlink signals to UEs indicating the cell type. Based on the cell type indication, the UE may communicate with the NR BS. For example, the UE may determine NR BSs to consider for cell selection, access, handover, and/or measurement based on the indicated cell type.

Figure 2:
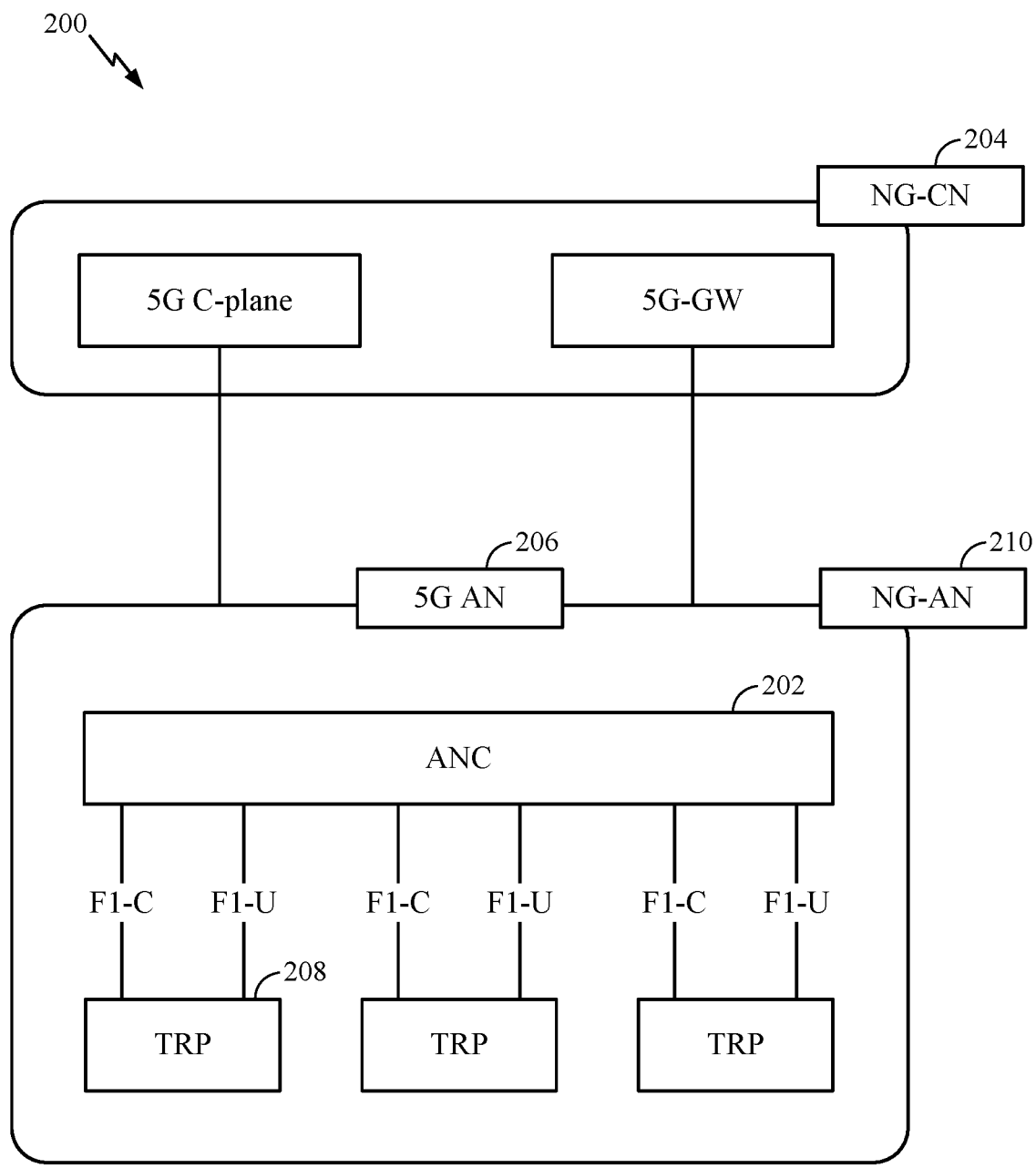
FIG. 2 is a block diagram illustrating an example logical architecture of a distributed RAN, in accordance with certain aspects of the present disclosure.

FIG. 2 illustrates an example logical architecture of a distributed radio access network (RAN) 200, which may be implemented in the wireless communication system illustrated in FIG. 1. A 5G access node 206 may include an access node controller (ANC) 202. The ANC may be a central unit (CU) of the distributed RAN 200. The backhaul interface to the next generation core network (NG-CN) 204 may terminate at the ANC. The backhaul interface to neighboring next generation access nodes (NG-ANs) may terminate at the ANC. The ANC may include one or more TRPs 208 (which may also be referred to as BSs, NR BSs, Node Bs, 5G NBs, APs, or some other term). As described above, a TRP may be used interchangeably with "cell."

The TRPs 208 may be a DU. The TRPs may be connected to one ANC (ANC 202) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture 200 may be used to illustrate fronthaul definition. The architecture may be defined that support fronthauling solutions across different deployment types. For example, the architecture may be based on transmit network capabilities (e.g., bandwidth, latency, and/or jitter).

The architecture may share features and/or components with LTE. According to aspects, the next generation AN (NG-AN) 210 may support dual connectivity with NR. The NG-AN may share a common fronthaul for LTE and NR.

The architecture may enable cooperation between and among TRPs 208. For example, cooperation may be preset within a TRP and/or across TRPs via the ANC 202. According to aspects, no inter-TRP interface may be needed or present.

According to aspects, a dynamic configuration of split logical functions may be present within the architecture 200. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be adaptably placed at the DU or CU (e.g., TRP or ANC, respectively). According to certain aspects, a BS may include a central unit (CU) (e.g., ANC 202) and/or one or more distributed units (e.g., one or more TRPs 208).

Figure 3:
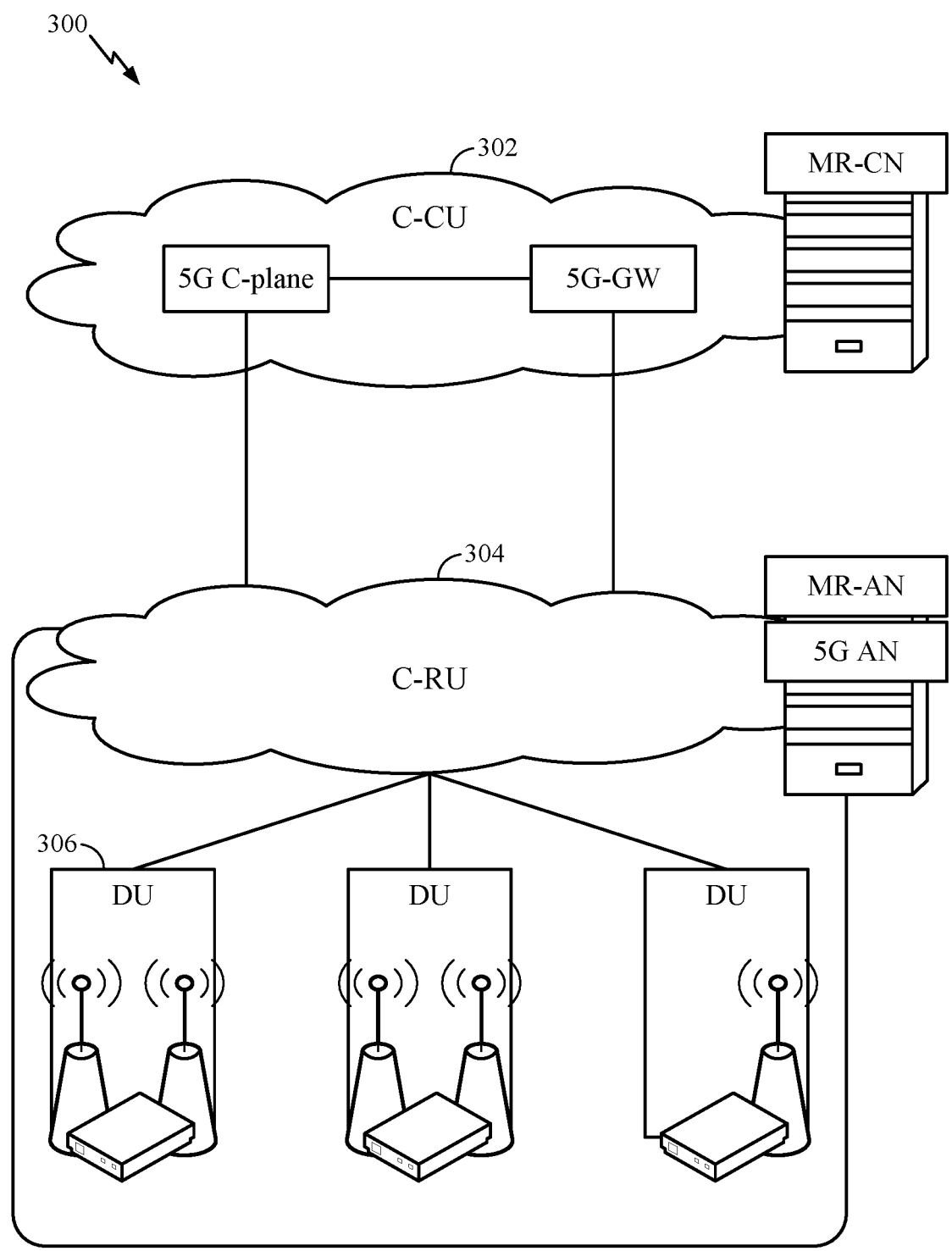
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. A centralized core network unit (C-CU) 302 may host core network functions. The C-CU may be centrally deployed. C-CU functionality may be offloaded (e.g., to advanced wireless services (AWS)), in an effort to handle peak capacity.

A centralized RAN unit (C-RU) 304 may host one or more ANC functions. Optionally, the C-RU may host core network functions locally. The C-RU may have distributed deployment. The C-RU may be closer to the network edge.

A DU 306 may host one or more TRPs (edge node (EN), an edge unit (EU), a radio head (RH), a smart radio head (SRH), or the like). The DU may be located at edges of the network with radio frequency (RF) functionality.

Figure 4:
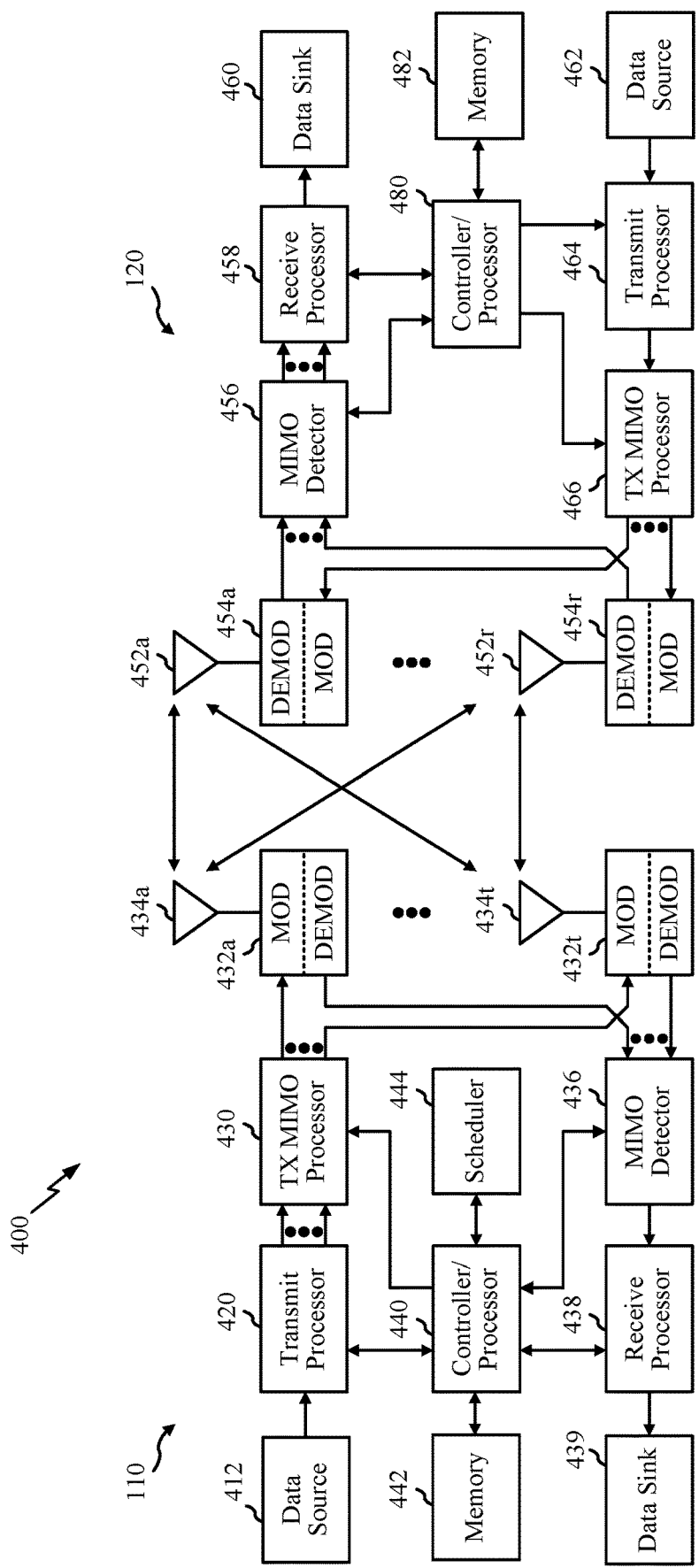
FIG. 4 is a block diagram conceptually illustrating a design of an example BS and user equipment (UE), in accordance with certain aspects of the present disclosure.

FIG. 4 illustrates example components of the BS 110 and UE 120 illustrated in FIG. 1, which may be used to implement aspects of the present disclosure. As described above, the BS may include a TRP. One or more components of the BS 110 and UE 120 may be used to practice aspects of the present disclosure. For example, antennas 452, Tx/Rx 222, processors 466, 458, 464, and/or controller/processor 480 of the UE 120 and/or antennas 434, processors 460, 420, 438, and/or controller/processor 440 of the BS 110 may be used to perform the operations described herein and illustrated with reference to FIG. 16.

According to aspects, for a restricted association scenario, the base station 110 may be the macro BS 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the Physical Broadcast Channel (PBCH), Physical Control Format Indicator Channel (PCFICH), Physical Hybrid ARQ Indicator Channel (PHICH), Physical Downlink Control Channel (PDCCH), etc. The data may be for the Physical Downlink Shared Channel (PDSCH), etc. The processor 420 may process (e.g., encode and symbol map) the data and control information to obtain data symbols and control symbols, respectively. The processor 420 may also generate reference symbols, e.g., for the PSS, SSS, and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (e.g., demodulate, deinterleave, and decode) the detected symbols, provide decoded data for the UE 120 to a data sink 460, and provide decoded control information to a controller/processor 480.

On the uplink, at the UE 120, a transmit processor 464 may receive and process data (e.g., for the Physical Uplink Shared Channel (PUSCH)) from a data source 462 and control information (e.g., for the Physical Uplink Control Channel (PUCCH) from the controller/processor 480. The transmit processor 464 may also generate reference symbols for a reference signal. The symbols from the transmit processor 464 may be precoded by a TX MIMO processor 466 if applicable, further processed by the demodulators 454a through 454r (e.g., for SC-FDM, etc.), and transmitted to the base station 110. At the BS 110, the uplink signals from the UE 120 may be received by the antennas 434, processed by the modulators 432, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the base station 110 and the UE 120, respectively. The processor 440 and/or other processors and modules at the base station 110 may perform or direct, e.g., the execution of the functional blocks illustrated in FIG. 6, and/or other processes for the techniques described herein. The processor 480 and/or other processors and modules at the UE 120 may also perform or direct, e.g., the execution of the functional blocks illustrated in FIG. 7, and/or other processes for the techniques described herein. The memories 442 and 482 may store data and program codes for the BS 110 and the UE 120, respectively. A scheduler 444 may schedule UEs for data transmission on the downlink and/or uplink.

Figure 5:
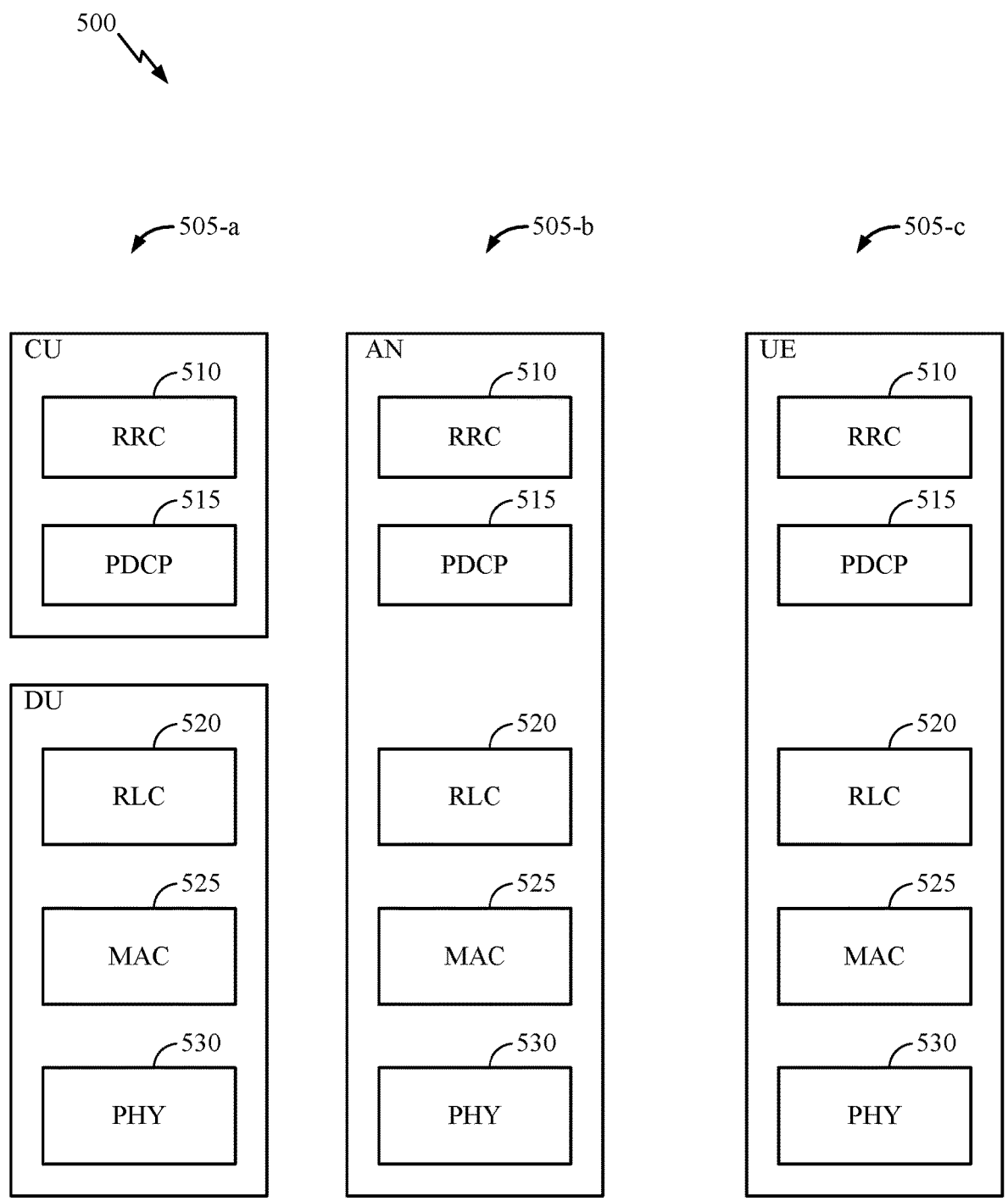
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a 5G system (e.g., a system that supports uplink-based mobility). Diagram 500 illustrates a communications protocol stack including a Radio Resource Control (RRC) layer 510, a Packet Data Convergence Protocol (PDCP) layer 515, a Radio Link Control (RLC) layer 520, a Medium Access Control (MAC) layer 525, and a Physical (PHY) layer 530. In various examples the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-a shows a split implementation of a protocol stack, in which implementation of the protocol stack is split between a centralized network access device (e.g., an ANC 202 in FIG. 2) and distributed network access device (e.g., DU 208 in FIG. 2). In the first option 505-a, an RRC layer 510 and a PDCP layer 515 may be implemented by the central unit, and an RLC layer 520, a MAC layer 525, and a PHY layer 530 may be implemented by the DU. In various examples the CU and the DU may be collocated or non-collocated. The first option 505-a may be useful in a macro cell, micro cell, or pico cell deployment.

A second option 505-b shows a unified implementation of a protocol stack, in which the protocol stack is implemented in a single network access device (e.g., access node (AN), new radio base station (NR BS), a new radio Node-B (NR NB), a network node (NN), or the like.). In the second option, the RRC layer 510, the PDCP layer 515, the RLC layer 520, the MAC layer 525, and the PHY layer 530 may each be implemented by the AN. The second option 505-b may be useful in a femto cell deployment.

Regardless of whether a network access device implements part or all of a protocol stack, a UE may implement an entire protocol stack 505-c (e.g., the RRC layer 510, the PDCP layer 515, the RLC layer 520, the MAC layer 525, and the PHY layer 530).

Figure 6:
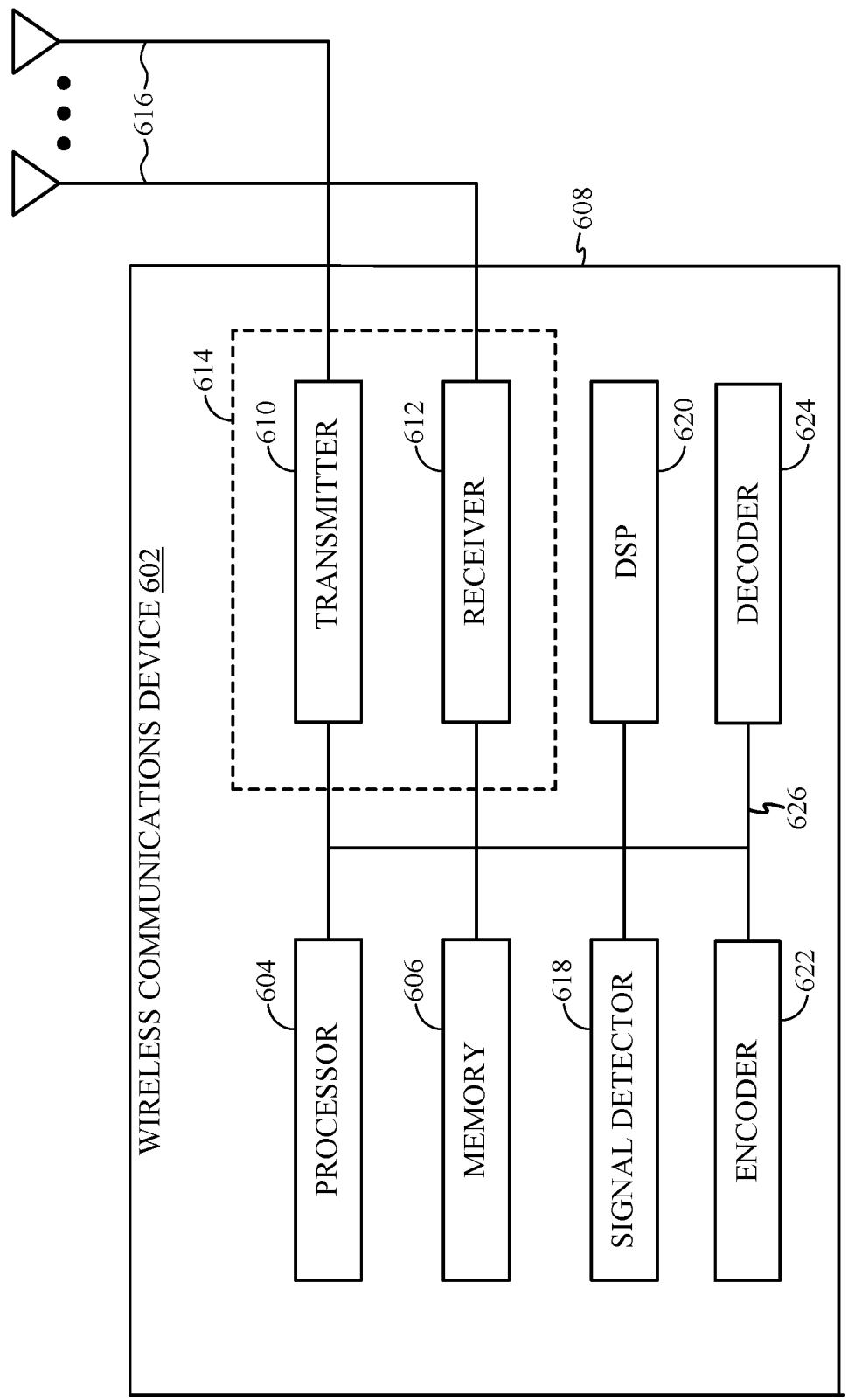
FIG. 6 illustrates a block diagram of an example wireless device in accordance with certain aspects of the present disclosure.

FIG. 6 illustrates various components that may be utilized in a wireless communications device 602 that may be employed within the wireless communication system from FIG. 1. The wireless communications device 602 is an example of a device that may be configured to implement the various methods described herein. The wireless communications device 602 may be a BS 110 from FIG. 1 or any of user equipments 120.

The wireless communications device 602 may include a processor 604 which controls operation of the wireless communications device 602. The processor 604 may also be referred to as a central processing unit (CPU). Memory 606, which may include both read-only memory (ROM) and random access memory (RAM), provides instructions and data to the processor 604. A portion of the memory 606 may also include non-volatile random access memory (NVRAM). The processor 604 typically performs logical and arithmetic operations based on program instructions stored within the memory 606. The instructions in the memory 606 may be executable to implement the methods described herein.

The wireless communications device 602 may also include a housing 608 that may include a transmitter 610 and a receiver 612 to allow transmission and reception of data between the wireless device 602 and a remote location. The transmitter 610 and receiver 612 may be combined into a transceiver 614. A single or a plurality of transmit antennas 616 may be attached to the housing 608 and electrically coupled to the transceiver 614. The wireless communications device 602 may also include (not shown) multiple transmitters, multiple receivers, and multiple transceivers.

The wireless communications device 602 may also include a signal detector 618 that may be used in an effort to detect and quantify the level of signals received by the transceiver 614. The signal detector 618 may detect such signals as total energy, energy per subcarrier per symbol, power spectral density and other signals. The wireless communications device 602 may also include a digital signal processor (DSP) 620 for use in processing signals.

Additionally, the wireless communications device 602 may also include an encoder 622 for use in encoding signals for transmission. The encoder may also store the encoded signals in a circular buffer (not shown) and perform rate matching on the encoded signals (e.g., by implementing operations 1600, shown in FIG. 16). Further, the wireless communication device 602 may include a decoder 624 for use in decoding received signals.

The various components of the wireless communications device 602 may be coupled together by a bus system 626, which may include a power bus, a control signal bus, and a status signal bus in addition to a data bus. The processor 604 may be configured to access instructions stored in the memory 606 to perform connectionless access, in accordance with aspects of the present disclosure discussed below.

Figure 7:
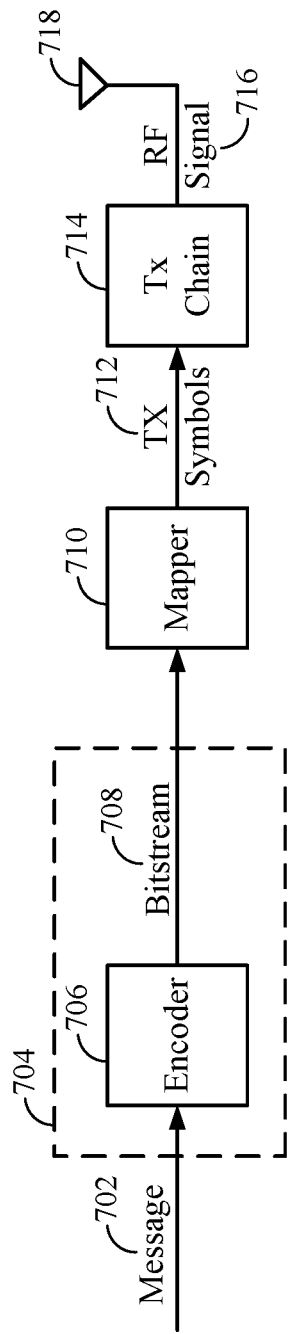
FIG. 7 is a simplified block diagram illustrating portions of a wireless device including an encoder, in accordance with certain aspects of the present disclosure.

FIG. 7 is a simplified block diagram illustrating portions of a wireless device (e.g., a BS 110 or a UE 120, both shown in FIG. 1), in accordance with certain aspects of the present disclosure. FIG. 7 illustrates a portion of a radio frequency (RF) modem 704 that may be configured to provide an encoded message for wireless transmission (e.g., using polar codes described below). In one example, an encoder 706 in a wireless device receives a message 702 for transmission. The message 702 may contain data and/or encoded voice or other content directed to the receiving device. The encoder 706 encodes the message using a suitable modulation and coding scheme (MC S), typically selected based on a configuration defined by the BS 110 or another network entity. The encoded bitstream 708 may then be stored in circular buffer and rate-matching may be performed on the stored encoded bitstream, for example, according to aspects of the present disclosure described in more detail below. After the encoded bitstream 708 is rate-matched, the encoded bitstream 708 may then be provided to a mapper 710 that generates a sequence of TX symbols 712 that are modulated, amplified and otherwise processed by TX chain 714 to produce an RF signal 716 for transmission through antenna 718.

Figure 8:
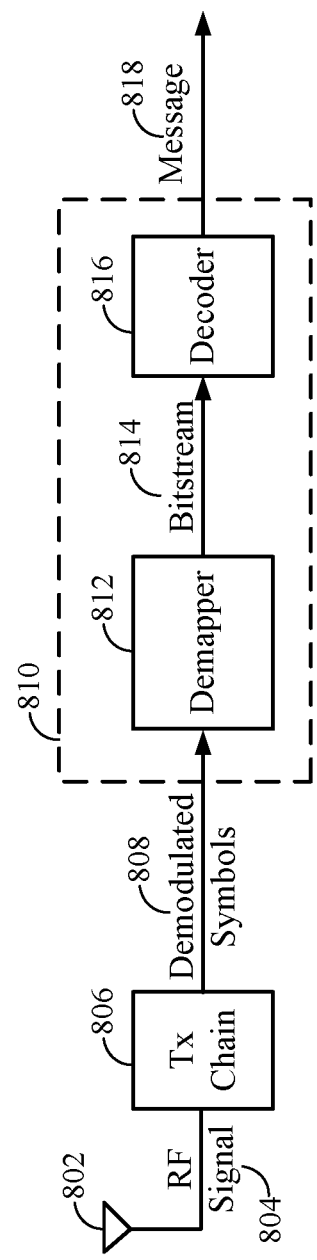
FIG. 8 is a simplified block diagram illustrating portions of a wireless device including a decoder, in accordance with certain aspects of the present disclosure.

FIG. 8 is a simplified block diagram illustrating portions of a wireless device (e.g., a BS 110 or a UE 120, both shown in FIG. 1), in accordance with certain aspects of the present disclosure. FIG. 8 illustrates a portion of a RF modem 810 that may be configured to receive and decode a wirelessly transmitted signal including an encoded message (e.g., a message encoded using a polar code as described below). In various examples, the modem 810 receiving the signal may reside at a user equipment, at a base station, or at any other suitable apparatus or means for carrying out the described functions. An antenna 802 provides an RF signal 804 (i.e., the RF signal 716, produced in FIG. 7, as received via the wireless medium) to an access terminal (e.g., UE 120). An RX chain 806 processes and demodulates the RF signal 804 and may provide a sequence of symbols 808 to a demapper 812, which produces a bitstream 814 representative of the encoded message.

A decoder 816 may then be used to decode m-bit information strings from a bitstream that has been encoded using a coding scheme (e.g., a Polar code). The decoder 816 may comprise a Viterbi decoder, an algebraic decoder, a butterfly decoder, or another suitable decoder. In one example, a Viterbi decoder employs the well-known Viterbi algorithm to find the most likely sequence of signaling states (the Viterbi path) that corresponds to a received bitstream 814. The bitstream 814 may be decoded based on a statistical analysis of LLRs calculated for the bitstream 814. In one example, a Viterbi decoder may compare and select the correct Viterbi path that defines a sequence of signaling states using a likelihood ratio test to generate LLRs from the bitstream 814. Likelihood ratios can be used to statistically compare the fit of a plurality of candidate Viterbi paths using a likelihood ratio test that compares the logarithm of a likelihood ratio for each candidate Viterbi path (i.e. the LLR) to determine which path is more likely to account for the sequence of symbols that produced the bitstream 814. The decoder 816 may then decode the bitstream 814 based on the LLRs to determine the message 818 containing data and/or encoded voice or other content transmitted from the base station (e.g., BS 110).

Figure 9:
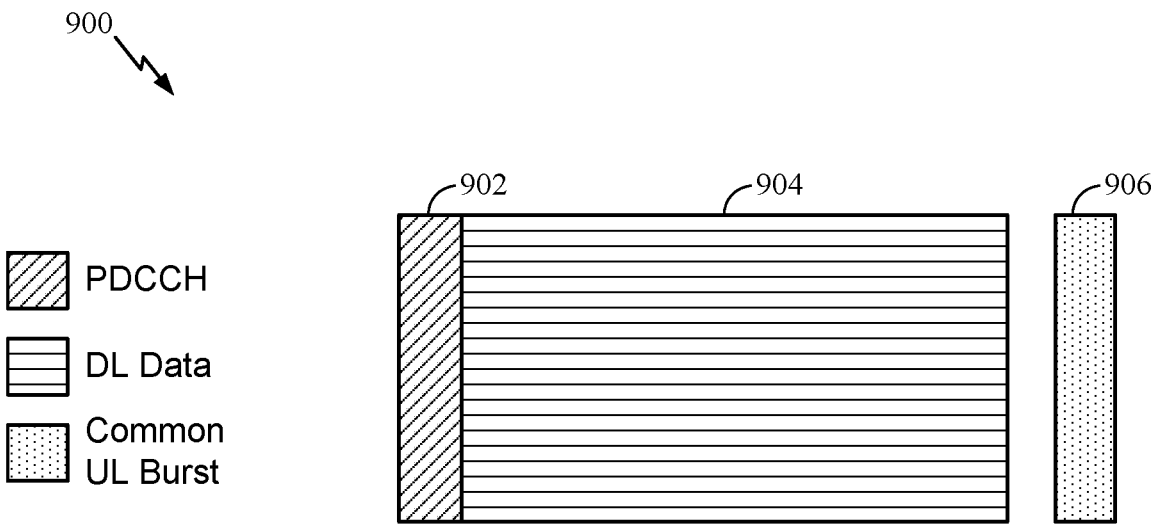
FIG. 9 illustrates an example of a DL-centric subframe, in accordance with certain aspects of the present disclosure.

FIG. 9 is a diagram 900 showing an example of a DL-centric subframe, which may be used by one or more devices (e.g., BS 110 and/or UE 120) to communicate in the wireless network 100. The DL-centric subframe may include a control portion 902. The control portion 902 may exist in the initial or beginning portion of the DL-centric subframe. The control portion 902 may include various scheduling information and/or control information corresponding to various portions of the DL-centric subframe. In some configurations, the control portion 902 may be a physical DL control channel (PDCCH), as indicated in FIG. 9. The DL-centric subframe may also include a DL data portion 904. The DL data portion 904 may sometimes be referred to as the payload of the DL-centric subframe. The DL data portion 904 may include the communication resources utilized to communicate DL data from the scheduling entity (e.g., UE or BS) to the subordinate entity (e.g., UE). In some configurations, the DL data portion 904 may be a physical DL shared channel (PD SCH).

The DL-centric subframe may also include a common UL portion 906. The common UL portion 906 may sometimes be referred to as an UL burst, a common UL burst, and/or various other suitable terms. The common UL portion 906 may include feedback information corresponding to various other portions of the DL-centric subframe. For example, the common UL portion 906 may include feedback information corresponding to the control portion 902. Non-limiting examples of feedback information may include an ACK signal, a NACK signal, a HARQ indicator, and/or various other suitable types of information. The common UL portion 906 may include additional or alternative information, such as information pertaining to random access channel (RACH) procedures, scheduling requests (SRs), and various other suitable types of information. As illustrated in FIG. 9, the end of the DL data portion 904 may be separated in time from the beginning of the common UL portion 906. This time separation may sometimes be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). One of ordinary skill in the art will understand that the foregoing is merely one example of a DL-centric subframe and alternative structures having similar features may exist without necessarily deviating from the aspects described herein.

Figure 10:
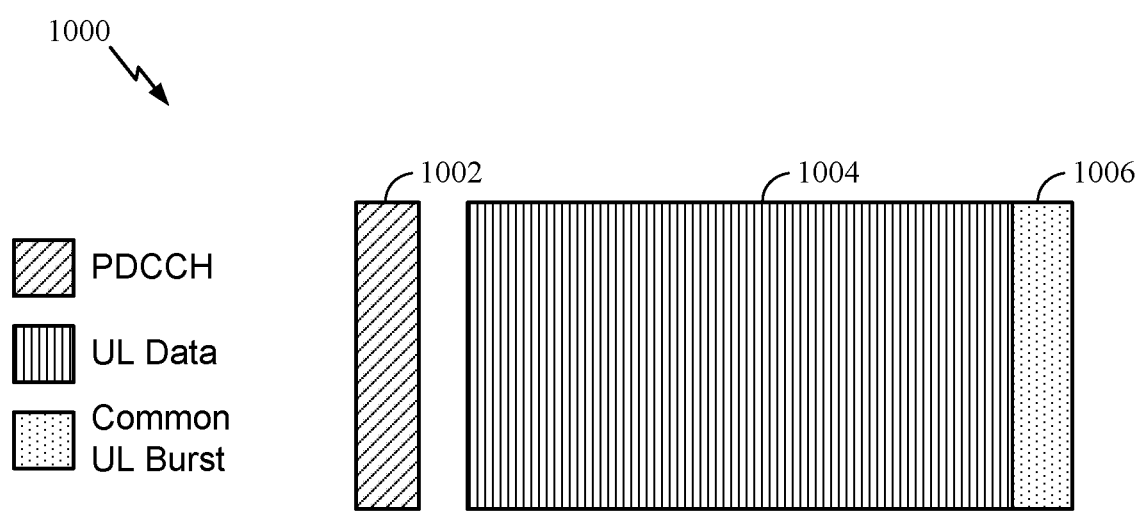
FIG. 10 illustrates an example of an UL-centric subframe, in accordance with certain aspects of the present disclosure.

FIG. 10 is a diagram 1000 showing an example of an UL-centric subframe, which may be used by one or more devices (e.g., BS 110 and/or UE 120) to communicate in the wireless network 100. The UL-centric subframe may include a control portion 1002. The control portion 1002 may exist in the initial or beginning portion of the UL-centric subframe. The control portion 1002 in FIG. 10 may be similar to the control portion described above with reference to FIG. 9. The UL-centric subframe may also include an UL data portion 1004. The UL data portion 1004 may sometimes be referred to as the payload of the UL-centric subframe. The UL portion may refer to the communication resources utilized to communicate UL data from the subordinate entity (e.g., UE) to the scheduling entity (e.g., UE or BS). In some configurations, the control portion 1002 may be a physical DL control channel (PDCCH).

As illustrated in FIG. 10, the end of the control portion 1002 may be separated in time from the beginning of the UL data portion 1004. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity). The UL-centric subframe may also include a common UL portion 1006. The common UL portion 1006 in FIG. 10 may be similar to the common UL portion 1006 described above with reference to FIG. 10. The common UL portion 1006 may additional or alternative include information pertaining to channel quality indicator (CQI), sounding reference signals (SRSs), and various other suitable types of information. One of ordinary skill in the art will understand that the foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the UEs.

Example Polar Codes

As noted above, polar codes may be used to encode a stream of bits for transmission. Polar codes are the first provably capacity-achieving coding scheme with almost linear (in block length) encoding and decoding complexity. Polar codes are widely considered as a candidate for error-correction in the next-generation wireless systems. Polar codes have many desirable properties such as deterministic construction (e.g., based on a fast Hadamard transform), very low and predictable error floors, and simple successive-cancellation (SC) based decoding.

Polar codes are linear block codes of length $N=2^n$ where their generator matrix is constructed using the $n^{th}$ Kronecker power of the matrix $$G = \begin{pmatrix} 1 & 0 \\ 1 & 1 \end{pmatrix},$$

denoted by $G^n$, also referred to as a Hadamard matrix of order n. For example, Equation (1) shows the resulting generator matrix for n=3.

$$G^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Eq. (1)}$$

According to certain aspects, a codeword may be generated (e.g., by a BS) by using the generator matrix to encode a number of input bits (e.g., information bits). For example, given a number of input bits $u=(u_0, u_1, \ldots, u_{N-1})$, a resulting codeword vector $x=(x_0, x_1, \ldots, x_{N-1})$ may be generated by encoding the input bits using the generator matrix G. This resulting codeword may then be rate matched (e.g., using techniques described herein) and transmitted by a base station over a wireless medium and received by a UE.

When the received vectors are decoded (e.g., by the UE) using a Successive Cancellation (SC) decoder (e.g., decoder 816), every estimated bit, $\hat{u}_i$, has a predetermined error probability given that bits $u_0^{i-1}$ were correctly decoded, that tends towards either 0 or 0.5. Moreover, the proportion of estimated bits with a low error probability tends towards the capacity of the underlying channel. Polar codes exploit a phenomenon called channel polarization by using the most reliable K bits to transmit information, while setting, or freezing, the remaining (N−K) bits to a predetermined value, such as 0, for example as explained below.

For very large N, polar codes transform the channel into N parallel "virtual" channels for the N information bits. If C is the capacity of the channel, then there are almost N*C channels which are completely noise free and there are N(1−C) channels which are completely noisy. The basic polar coding scheme then involves freezing (i.e., not transmitting) the information bits to be sent along the completely noisy channel and sending information only along the perfect channels. For short-to-medium N, this polarization may not be complete in the sense there could be several channels which are neither completely useless nor completely noise free (i.e., channels that are in transition). Depending on the rate of transmission, these channels in the transition are either frozen or they are used for transmission.

Example Time Based Redundancy Version Determination for Grant-Free Signaling

Aspects of the present disclosure relate to grant-free (GF) uplink (UL) transmissions in ultra-reliable low latency communications (URLLC). According to previously known techniques, there are at least two types of grant-free uplink communications. In a first type of GF UL communications, a UE performs a first transmission in a grant-free manner by randomly selecting certain resources (e.g., time and frequency resources) or using semi-statistically configured resources and transmitting on the selected resources, a behavior that may conflict with scheduled on-going eMBB traffic. If the first transmission fails in decoding, but is successfully detected by a serving cell, then the cell may transmit a downlink (DL) physical downlink control channel (PDCCH) in a next mini-slot that schedules a resource for the UE to use in transmitting a second transmission (i.e., a retransmission of the first transmission). In the meanwhile, on-going eMBB traffic on the scheduled resource will be suspended (e.g., the cell does not schedule any DL or UL transmissions on the resource). In a second type of GF UL communications, second and later UL transmissions by a UE are also GF. That is, a UE transmits GF UL transmissions repeatedly until the UE receives an acknowledgment (ACK) for one of the transmissions or the UE transmits a maximum number, K, of repeated GF UL transmissions.

According to aspects of the present disclosure, a UE may use incremental redundancy (IR) while transmitting a GF UL transmission of either of the above described types. A UE using IR generates several (e.g., four) redundancy versions (RVs) of the data to be transmitted, and the UE selects one of the RVs of the data for transmission in a first GF UL transmission. As used herein, a "redundancy version of data" refers to one of the generated versions of the data, from which a receiver may recover the data. If the receiver does not correctly receive the redundancy version of the data, the receiver may combine the incorrectly received redundancy version of the data with another redundancy version of the data (e.g., from another transmission, which may or may not be correctly received) and possibly recover the data. If the UE transmits a second GF UL transmission of the same data (e.g., the UE did not receive an ACK of the first transmission), the UE may select a different RV of the data for the second transmission (e.g., to improve the chance that the receiver can recover the data by combining the different RVs of the data). Each time the UE transmits the data, the UE may select a different RV of the data. The UE may continue to retransmit the data until the data is acknowledged (e.g., the UE receives an ACK for the data) or the number of retransmissions is equal to a maximum number of HARQ retransmissions parameter, which may be set by higher layers, for example. If the maximum number of HARQ retransmissions parameter is larger than the number of RVs, then the UE may repeat earlier-sent RVs in later retransmissions. A base station receiving the different RVs of the data may decode any one of the RVs and may, if the base station cannot decode any single RV, decode the data based on a combination of the different RVs. A redundancy version (RV) pattern, e.g. {0,2,3,1}, needs to be known to a receiving base station (e.g., an eNB or a gNB) for the base station to use IR combining. This RV pattern may be signaled to the base station by the UE in uplink control information (UCI) via an UL control channel.

According to aspects of the present disclosure, for URLLC grant-free UL transmissions, a highly reliable (e.g., a block error rate (BLER) of $10^{-5}$ $10^{-7}$) uplink control information (UCI) transmission is desirable to convey the RV pattern (e.g., from the UE to a receiving next generation NodeB (gNB)). Otherwise, the performance of URLLC data decoding could be sizably degraded via IR combining at a receiving gNB, due to the loss of the RV pattern. For a single-shot (e.g., not repeated) transmission of UCI, to achieve such high reliability is non-trivial and requires significant amount of resources.

In aspects of the present disclosure, an implicit approach, i.e. a time-index based technique, to signal the RV index for URLLC GF UL transmissions is described. The proposed approach is simple to implement and may resolve the aforementioned UCI reliability issue.

In aspects of the present disclosure, a UE using IR for GF UL transmissions may determine an RV for a transmission based on a time of the transmission. That is, a UE transmitting a grant-free uplink transmission of data using incremental redundancy may determine which redundancy version of the data to transmit in the grant-free uplink transmission based on a time when the UE is transmitting the grant-free uplink transmission.

According to aspects of the present disclosure, a BS receiving a GF UL transmission from a UE may determine an RV of the transmission based on a time that the BS receives the transmission. That is, a BS (e.g., an eNB or a gNB) receiving a grant-free uplink transmission of data from a UE using incremental redundancy may determine which redundancy version of the data the UE used when the UE transmitted the grant-free uplink transmission based on a time when the BS is receiving the grant-free uplink transmission.

Figure 11:
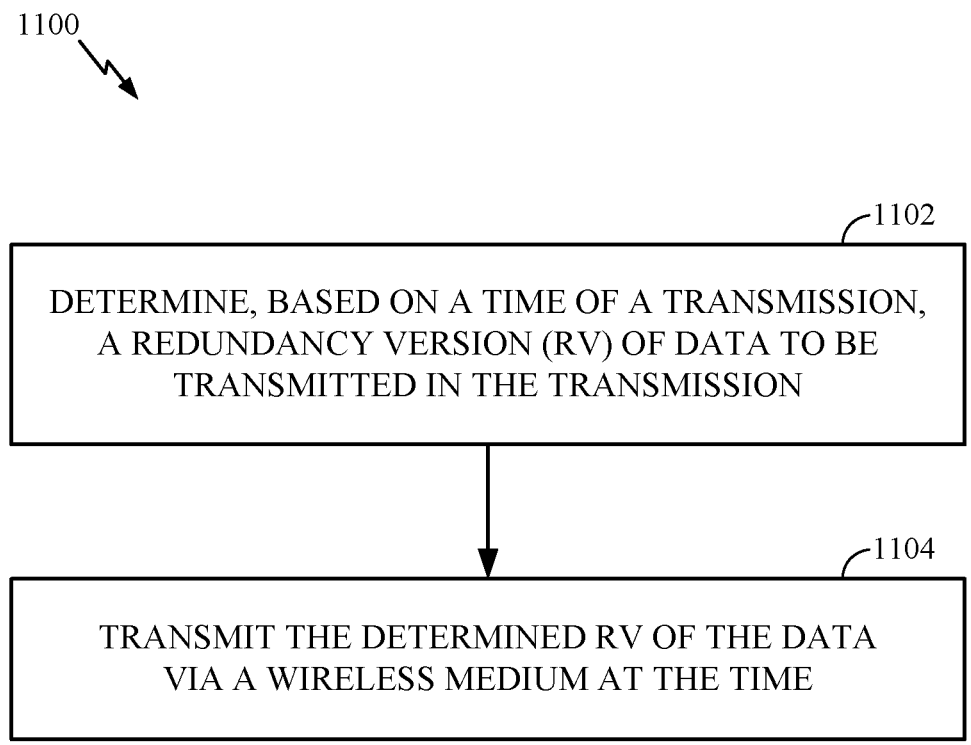
FIG. 11 illustrates example operations for wireless communications, according to aspects of the present disclosure.

FIG. 11 illustrates example operations 1100 for wireless communications for determining a redundancy version to transmit in a grant-free uplink transmission. Operations 1100 may be performed by a wireless communications device, such as user equipment 120, shown in FIG. 1, and/or wireless communications device 602.

Operations 1100 begin at block 1102 by the UE determining, based on a time of a transmission, a redundancy version (RV) of data to be transmitted in the transmission. For example, UE 120 (shown in FIG. 1) determines, based on a time of a transmission, a redundancy version of data (e.g., one of several RVs of the data in the transmission, with the RV determined based on a value selected from a redundancy version pattern, such as {0, 2, 3, 1}) to be transmitted in the transmission.

At block 1104, the UE transmits the determined RV of the data via a wireless medium at the time. Continuing the example, the UE 120 transmits the determined RV of the data (i.e., the RV of the data determined in block 1102) via a wireless medium at the time (i.e., the time mentioned in block 1102).

Figure 12:
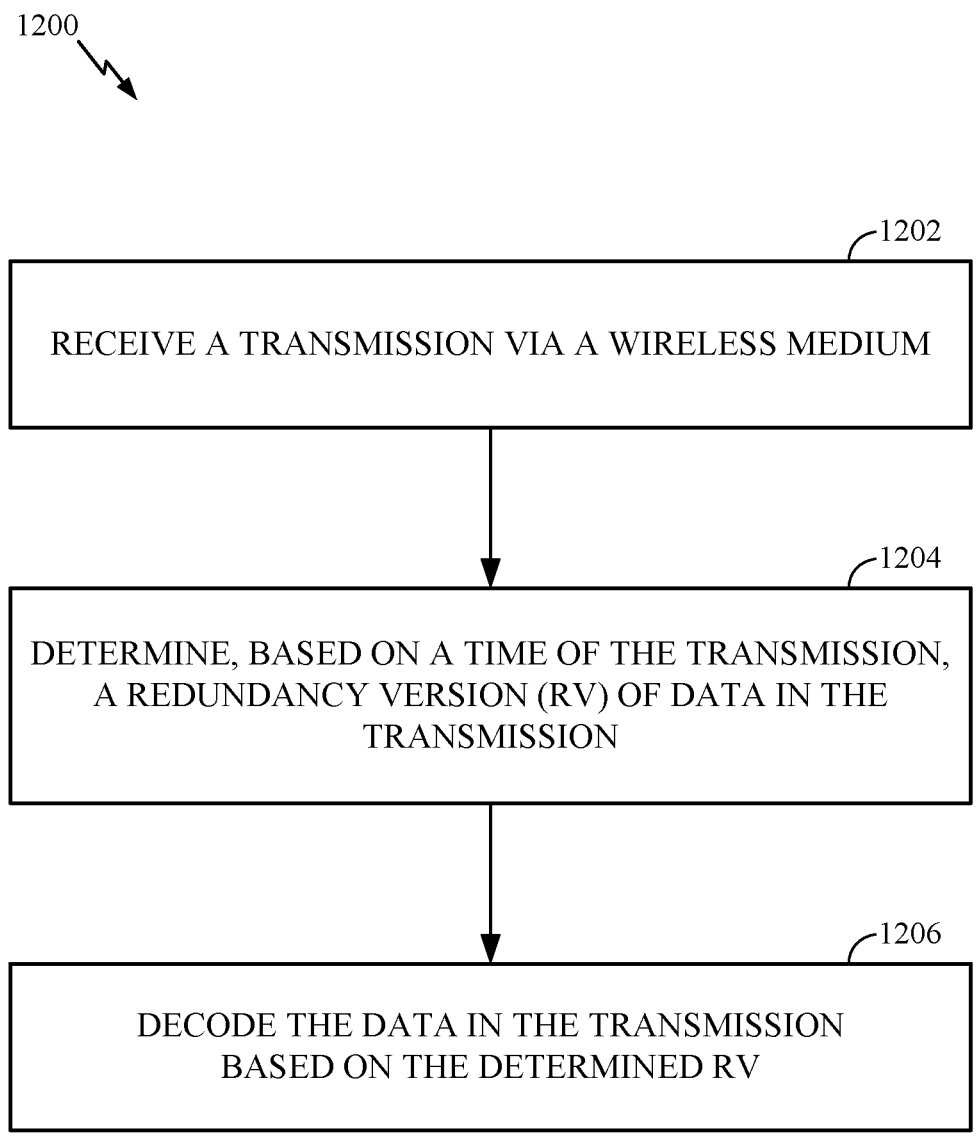
FIG. 12 illustrates example operations for wireless communications, in accordance with certain aspects of the present disclosure.

FIG. 12 illustrates example operations 1200 for wireless communications for determining a redundancy version of data received in a grant-free uplink transmission. Operations 1200 may be performed by a wireless communications device, such as base station 110, shown in FIG. 1, and/or wireless communications device 602.

Operations 1200 begin at block 1202 by the BS receiving a transmission via a wireless medium. For example, BS 110 (shown in FIG. 1) receives a transmission (e.g., from UE 120) via a wireless medium.

At block 1204, the BS determines, based on a time of the transmission, a redundancy version (RV) of data in the transmission. Continuing the example from above, the BS 110 determines, based on a time of the transmission (i.e., the transmission received in block 1202) a redundancy version (e.g., one of several possible RVs of the data in the transmission, with the RV determined based on a value selected from a redundancy version pattern, such as {0, 2, 3, 1}) of data in the transmission.

At block 1206, the BS decodes the data in the transmission based on the determined RV. Continuing the example from above, the BS 110 decodes the data in the transmission (i.e., the transmission from block 1202) based on the determined RV (i.e., the RV determined by the BS in block 1204.

According to aspects of the present disclosure, when a UE transmits an URLLC GF UL transmission, each RV index may be associated with a time index, such that a receiving base station (e.g., an eNB or a gNB) can obtain (i.e., determine) the RV index for the URLLC GF UL transmission without receiving explicit UL signaling of the RV index.

In aspects of the present disclosure, RV ID represents an index in an RV pattern such as {0,2,3,1}, {0,3,0,3} or {0,0,0,0}. Thus, RV ID may be in the range from 0 to 3 for any of the exemplary RV patterns. A given RV ID may indicate different RVs, depending on the RV pattern in use. For example, RV ID=1 indicates RV=2 for the first exemplary pattern, but the same RV ID=1 indicates RV=3 for the second RV pattern, and indicates RV=0 for the third RV pattern.

According to aspects of the present disclosure, the time index can refer to at least one of: 1) an OFDM symbol index, 2) a mini-slot index, and 3) a slot index.

In aspects of the present disclosure, to align and/or associate the time index with the RV IDs of HARQ transmissions, an offset may be used for each HARQ transmission.

According to aspects of the present disclosure, the RV pattern and the selection of time index for a GF UL transmission may be agreed between a gNB and each UE (e.g., each UE served by the gNB) in prior RRC signaling or dynamic L1 signaling prior to the UE transmitting a GF UL transmission.

Figure 13:
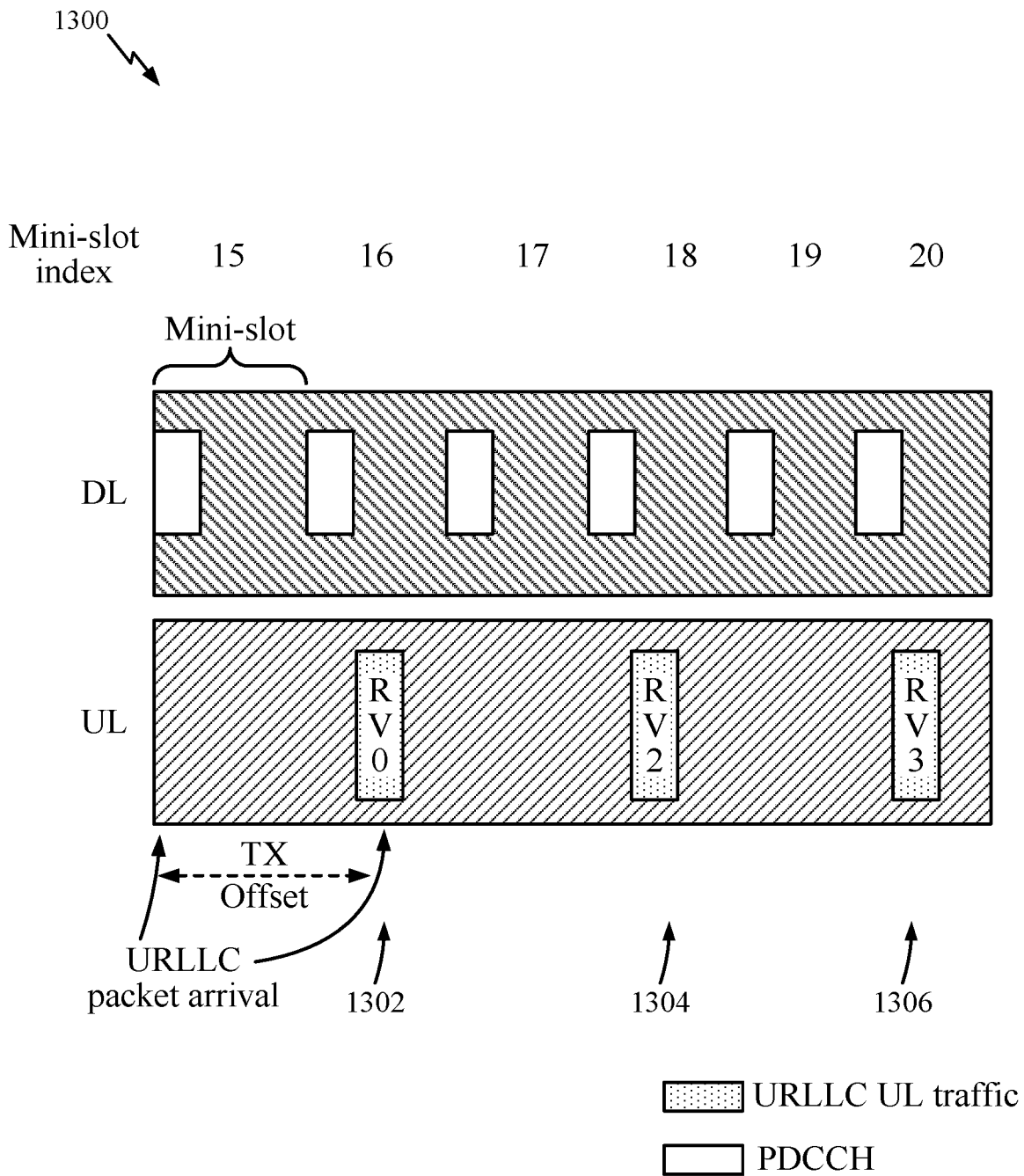
FIG. 13 illustrates an exemplary timeline of transmissions between a BS and a UE, in accordance with certain aspects of the present disclosure.

FIG. 13 illustrates an exemplary timeline 1300 of transmissions between a BS and a UE performing GF UL transmissions, in accordance with aspects of the present disclosure. In the exemplary timeline, a UE determines an RV ID from a set {0,2,3,1}, where each index is associated with a mini-slot time index {8n, 8n+2, 8n+4, 8n+6} for n=0, 1, 2, 3, . . . . In particular, in the exemplary timeline, if the UE transmits a GF UL transmission in a mini-slot having an index of the form 8n, then the UE selects RV ID 0 for that GF UL transmission, as shown at 1302. Similarly, if the UE transmits a GF UL transmission in a mini-slot having an index of the form 8n+2, then the UE selects RV ID 2 for that GF UL transmission, as shown at 1304. A mini-slot having an index of the form 8n+4 results in the UE selecting RV ID 3, as shown at 1306, while a mini-slot having an index of the form 8n+6 results in the UE selecting RV ID 1 for the transmission.

According to aspects of the present disclosure, a device that receives an initial transmission of a transport block may have a higher probability of successfully decoding redundancy version 0 of the transport block than other RVs of the transport block. It may be desirable for a UE transmitting a transport block via a grant-free uplink transmission to ensure that the initial transmission of the transport block is transmitted with a particular RV ID (e.g., RV ID 0). Thus, in aspects of the present disclosure, a UE that determines to transmit a transport block via a grant-free uplink transmission may delay the initial transmission of the transport block until a time that is associated with the particular RV ID.

In previously known techniques, the higher layer configured parameters (e.g., configured via RRC signaling) repK and repK-RV respectively define the K repetitions to be applied to a transmitted transport block, and the redundancy version pattern to be applied to the repetitions. For the $n^{th}$ transmission occasion among K repetitions, n=1, 2, . . . , K, that transmission is associated with the $(mod(n-1, 4)+1)^{th}$ value in the configured RV sequence. The initial transmission of a transport block may start at the first transmission occasion of the K repetitions if the configured RV sequence is {0,2,3,1}, any of the transmission occasions of the K repetitions that are associated with RV=0 if the configured RV sequence is {0,3,0,3}, or any of the transmission occasions of the K repetitions if the configured RV sequence is {0,0,0,0}, except the last transmission occasion when K=8.

Figure 14:
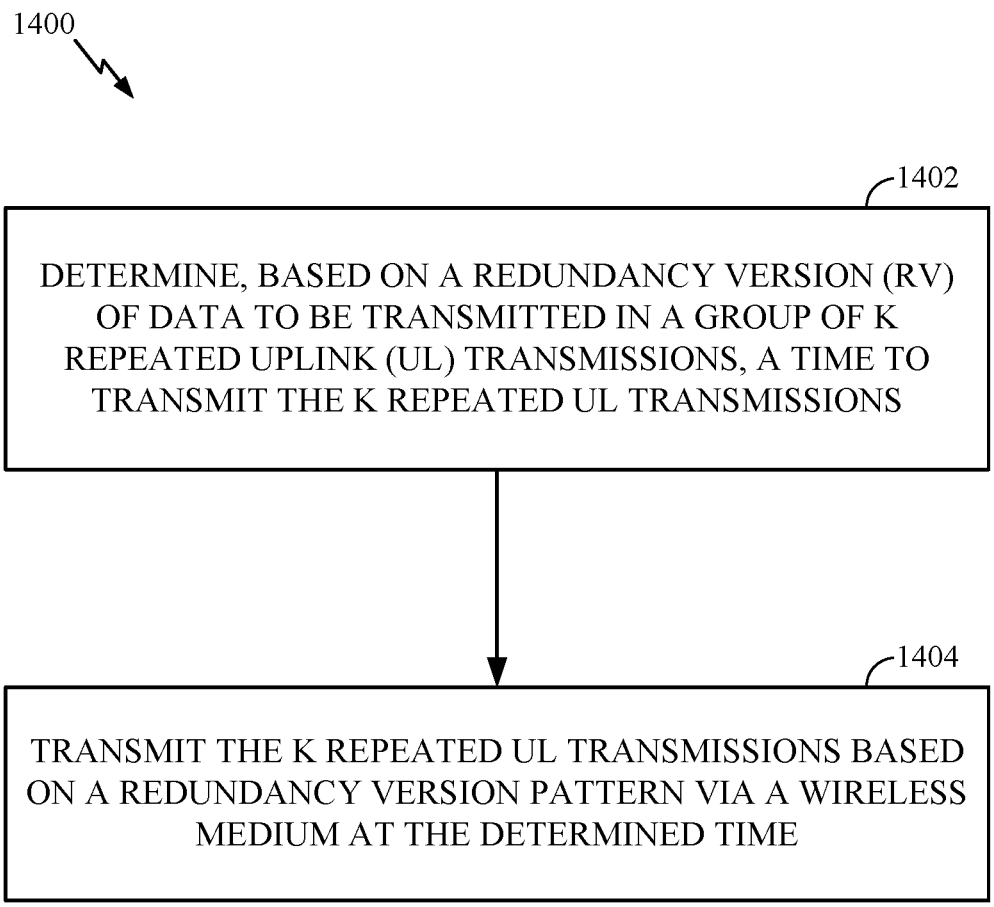
FIG. 14 illustrates example operations for determining a time to transmit a grant-free uplink transmission, in accordance with aspects of the present disclosure.

FIG. 14 illustrates example operations 1400 for wireless communications for determining a time to transmit a grant-free uplink transmission having a particular redundancy version. Operations 1400 may be performed by a wireless communications device, such as user equipment 120, shown in FIG. 1, and/or wireless communications device 602.

Operations 1400 begin at block 1402 by the UE determining, based on a redundancy version (RV) of data to be transmitted in a group of K repeated uplink (UL) transmissions, a time to transmit the K repeated UL transmissions. For example, UE 120 (shown in FIG. 1) determines, based on a redundancy version of data (e.g., one of several possible RVs of the data, with the RV determined based on a value selected from a redundancy version pattern, such as {0, 2, 3, 1}) to be transmitted in the transmission, a time to transmit K repeated uplink transmissions.

At block 1404, the UE transmits the K repeated UL transmissions based on a redundancy version pattern via a wireless medium at the determined time. Continuing the example, the UE 120 transmits the redundancy version of the data (i.e., the RV of the data mentioned in block 1402) via a wireless medium at the determined time (i.e., the time determined in block 1402).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RF front end for transmission.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting, means for receiving, means for determining, means for performing (e.g., rate-matching), means for encoding, means for, puncturing, means for repeating, means for shortening, and/or means for generating may comprise one or more processors or antennas at the BS 110 or UE 120, such as the transmit processor 220, controller/processor 240, receive processor 238, or antennas 234 at the BS 110 and/or the transmit processor 264, controller/processor 280, receive processor 258, or antennas 252 at the UE 120.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A method for wireless communications, comprising:
determining, based on an orthogonal frequency division multiplexing (OFDM) symbol index associated with a time of an uplink transmission, a redundancy version (RV) of data to be transmitted in the uplink transmission; and
transmitting the determined RV of the data via a wireless medium at the time.

2. The method of claim 1, wherein the determination is based on a mini-slot index associated with the time.

3. The method of claim 1, wherein the determination is based on a slot index associated with the time.

4. The method of claim 1, further comprising:
receiving radio resource control (RRC) signaling indicating a mapping of times to RVs.

5. The method of claim 1, further comprising:
receiving layer 1 (L1) signaling indicating a mapping of times to RVs.

6. A method for wireless communications, comprising:
receiving an uplink transmission via a wireless medium;
determining, based on an orthogonal frequency division multiplexing (OFDM) symbol index associated with a time of the uplink transmission, a redundancy version (RV) of data in the uplink transmission; and decoding the data in the uplink transmission based on the determined RV.

7. The method of claim 6, wherein the determination is based on a mini-slot index associated with the time.

8. The method of claim 6, wherein the determination is based on a slot index associated with the time.

9. The method of claim 6, further comprising:
transmitting radio resource control (RRC) signaling indicating a mapping of times to RVs.

10. The method of claim 6, further comprising:
transmitting layer 1 (L1) signaling indicating a mapping of times to RVs.

11. A method for wireless communications, comprising:
determining, based on an orthogonal frequency division multiplexing (OFDM) symbol index associated with a redundancy version (RV) of data to be transmitted in a group of K repeated uplink (UL) transmissions, a time to transmit the K repeated UL transmissions; and
transmitting the K repeated UL transmissions based on a redundancy version pattern via a wireless medium at the determined time.

12. The method of claim 11, wherein the determination is based on a mini-slot index associated with the RV.

13. The method of claim 11, wherein the determination is based on a slot index associated with the RV.

14. The method of claim 11, further comprising:
receiving radio resource control (RRC) signaling indicating a mapping of RVs to times.

15. The method of claim 11, further comprising:
receiving layer 1 (L1) signaling indicating a mapping of RVs to times.

16. An apparatus for wireless communications in a network, comprising:
a processor configured to:
determine, based on an orthogonal frequency division multiplexing (OFDM) symbol index associated with a time of an uplink transmission, a redundancy version (RV) of data to be transmitted in the uplink transmission, and
cause the apparatus to transmit the determined RV of the data via a wireless medium at the time; and
a memory coupled with the processor.

17. The apparatus of claim 16, wherein the processor is configured to determine the RV of data to be transmitted in the uplink transmission based on a mini-slot index associated with the time.

18. The apparatus of claim 16, wherein the processor is configured to determine the RV of data to be transmitted in the uplink transmission based on a slot index associated with the time.

19. The apparatus of claim 16, wherein the processor is configured to:
cause the apparatus to receive radio resource control (RRC) signaling indicating a mapping of times to RVs.

20. The apparatus of claim 16, wherein the processor is configured to:
cause the apparatus to receive layer 1 (L1) signaling indicating a mapping of times to RVs.

21. An apparatus for wireless communications in a network, comprising:
a processor configured to:
cause the apparatus to receive a transmission via a wireless medium,
determine, based on an orthogonal frequency division multiplexing (OFDM) symbol index associated with a time of an uplink transmission, a redundancy version (RV) of data in the uplink transmission, and
decode the data in the uplink transmission based on the determined RV; and
a memory coupled with the processor.

22. The apparatus of claim 21, wherein the processor is configured to determine the RV of data in the uplink transmission based on a mini-slot index associated with the time.

23. The apparatus of claim 21, wherein the processor is configured to determine the RV of data in the uplink transmission based on a slot index associated with the time.

24. The apparatus of claim 21, wherein the processor is configured to:
cause the apparatus to transmit radio resource control (RRC) signaling indicating a mapping of times to RVs.

25. The apparatus of claim 21, wherein the processor is configured to:
cause the apparatus to transmit layer 1 (L1) signaling indicating a mapping of times to RVs.

26. An apparatus for wireless communications in a network, comprising:
a processor configured to:
determine, based on an orthogonal frequency division multiplexing (OFDM) symbol index associated with a redundancy version (RV) of data to be transmitted in a group of K repeated uplink (UL) transmissions, a time to transmit the K repeated uplink (UL) transmissions, and
cause the apparatus to transmit the K repeated UL transmissions based on a redundancy version pattern via a wireless medium at the determined time; and
a memory coupled with the processor.

27. The apparatus of claim 26, wherein the processor is configured to determine the time to transmit the K repeated UL transmissions based on a mini-slot index associated with the RV.

28. The apparatus of claim 26, wherein the processor is configured to determine the time to transmit the K repeated UL transmissions based on a slot index associated with the RV.

29. The apparatus of claim 26, wherein the processor is configured to:
cause the apparatus to receive radio resource control (RRC) signaling indicating a mapping of RVs to times.

30. The apparatus of claim 26, wherein the processor is configured to:
cause the apparatus to receive layer 1 (L1) signaling indicating a mapping of RVs to times.

* * * * *